United States Patent [19]
Wu et al.

[11] Patent Number: 5,701,100
[45] Date of Patent: Dec. 23, 1997

[54] SECOND-ORDER HIGHPASS DIFFERENCE FILTER

[75] Inventors: Chien-Ping Wu; Chang-Da Tsai, both of Taipei, Taiwan

[73] Assignee: National Science Council, Taipei, Taiwan

[21] Appl. No.: 709,867

[22] Filed: Sep. 10, 1996

[51] Int. Cl.$^6$ ............................... H03K 5/00; H03B 1/04
[52] U.S. Cl. ....................... 327/559; 327/561; 327/552; 330/109; 330/303
[58] Field of Search ......................... 327/552, 553, 327/555, 556, 557, 558, 559, 560, 311, 561; 330/294, 306, 107, 109, 303

[56] References Cited

U.S. PATENT DOCUMENTS 3,787,774 1/1974 Tietze et al. ............................ 327/559

OTHER PUBLICATIONS

H.W. Smit et. al.; "A Low-Cost Multichannel Preamplifier for Physiological Signals", IEEE Transactions on Biomedical Engineering, vol. BME–34, No. 4, Apr. 1987; pp. 307–310.

*Primary Examiner*—Timothy P. Callahan
*Assistant Examiner*—Dinh Le
*Attorney, Agent, or Firm*—Bacon & Thomas

[57] ABSTRACT

A second-order highpass difference filter constructed according to the present invention includes a difference amplifier and a feedback processing circuit. The difference amplifier includes an operational amplifier $OP_1$, and four resistors $R_1$, $R_2$, $R_3$ and $R_4$. The feedback processing circuit is composed of two operational amplifiers $OP_2$ and $OP_3$, resistors $R_5$ and $R_6$, and two serial capacitors $C_1$ and $C_2$. The inverting and noninverting terminals of the operational amplifier $OP_3$ are connected to the output of the difference amplifier and of the operational amplifier $OP_2$, respectively. The output of the operational amplifier $OP_2$ is also fed back to the inverting terminal of the operational amplifier $OP_2$ via the resistor $R_5$, and the noninverting terminal of the operational amplifier $OP_2$ is grounded. The output terminal of the operational amplifier $OP_3$ is connected to the inverting terminal of the operational amplifier $OP_2$ via the two serial capacitors $C_1$ and $C_2$ and to the noninverting terminal of the operational amplifier $OP_1$ via the resistor $R_4$. The two serial capacitors $C_1$ and $C_2$ are connected therebetween to one terminal of the resistor $R_6$ of which another terminal is grounded.

2 Claims, 5 Drawing Sheets

5,701,100

1

SECOND-ORDER HIGHPASS DIFFERENCE FILTER

FIELD OF THE INVENTION

The present invention is related to a highpass difference filter, and in particular to a second-order highpass difference filter which is able to remove low-frequency signal with attenuation of −40 dB/decade and has a differential gain as well.

BACKGROUND OF THE INVENTION

Filters are almost inevitably required for electrical signals processing. In human body, there are many diagnosis-valued signals which are presented as differential signal, e.g. electrocardiogram, and electroencephalogram, etc.. However, upon recording these physiological signals the measured signals are often corrupted by low-frequency interference. The interference are caused by the respiration and motion of the subject as well as the differential dc voltage due to the polarization of the electrodes. As a result, the measured signals are degraded or the physiological interpretations are disrupted. Thus, suppressing the low-frequency interference becomes important and is the first step in the preprocessing of physiological signals.

In the literature, there are many excellent digital signal processing techniques to remove the low-frequency interference. When the magnitude of the low-frequency interference is large, the resolution of signals in analog-to-digit conversion is limited, and the converted data have not enough precision for physiological interpretations. Hence, the interference should be attenuated by an analog highpass filter before performing analog-to-digit conversion. A novel idea to solve the precision-limited problem is to consider an additional highpass filtering function in a preamplifier. Several circuits which feed the output signals back to the input stage via the integrating network have been developed to realize this idea. However, the integrating network only forms a first-order highpass filter in the preamplifier. The first-order highpass filter filter having an attenuation of −20 dB/decade is not good enough to suppress the high-intensity low-frequency interference. In order to obtain a desired better suppression of unwanted interference, a new circuit is presented in this invention for the realization of a second-order highpass difference filter.

SUMMARY OF THE INVENTION

A second-order highpass difference filter constructed according to the present invention comprises a difference amplifier and a feedback processing circuit. The difference amplifier comprises an operational amplifier $OP_1$, and four resistors $R_1$, $R_2$, $R_3$ and $R_4$, wherein $R_2/R_1=R_4/R_3$. An input voltage $V_1$ is fed to the inverting terminal (−) of the operational amplifier $OP_1$ via the resistor $R_1$. Another input voltage $V_2$ is fed to the noninverting terminal (+) of the operational amplifier $OP_1$ via the resistor $R_3$. The output of the operational amplifier $OP_1$ is fed back to the inverting terminal (−) of the operational amplifier $OP_1$ via the resistor $R_2$. The feedback processing circuit comprising two operational amplifiers $OP_2$ and $OP_3$, two resistors $R_5$ and $R_6$, and two serial capacitors $C_1$ and $C_2$. The inverting terminal (−) and the noninverting terminal (+) of the operational amplifier $OP_3$ are connected to the output terminals of the operational amplifier $OP_1$ and of the operational amplifier $OP_2$, respectively. The output of the operational amplifier $OP_2$ is also fed back to the inverting terminal (−) of the operational amplifier $OP_2$ via the resistor $R_5$, and the noninverting (+) terminal of the operational amplifier $OP_2$ is grounded. The output terminal of the operational amplifier $OP_3$ is connected to the inverting terminal of the operational amplifier $O_2$ via the two serial capacitors $C_1$ and $C_2$ and to the noninverting terminal of the operational amplifier $OP_1$ via the resistor $R_4$. The two serial capacitors $C_1$ and $C_2$ are connected therebetween to one terminal of the resistor $R_6$ of which another terminal is grounded.

BRIEF DESCRIPTION OF THE DRAWINGS

The foregoing and other objects, aspects and advantages will be better understood from the following detailed description of the preferred embodiments of the invention with reference to the accompanying drawings wherein like numerals represent like elements and in which.

DETAILED DESCRIPTION OF THE PREFERRED EMBODIMENTS

Figure 1:
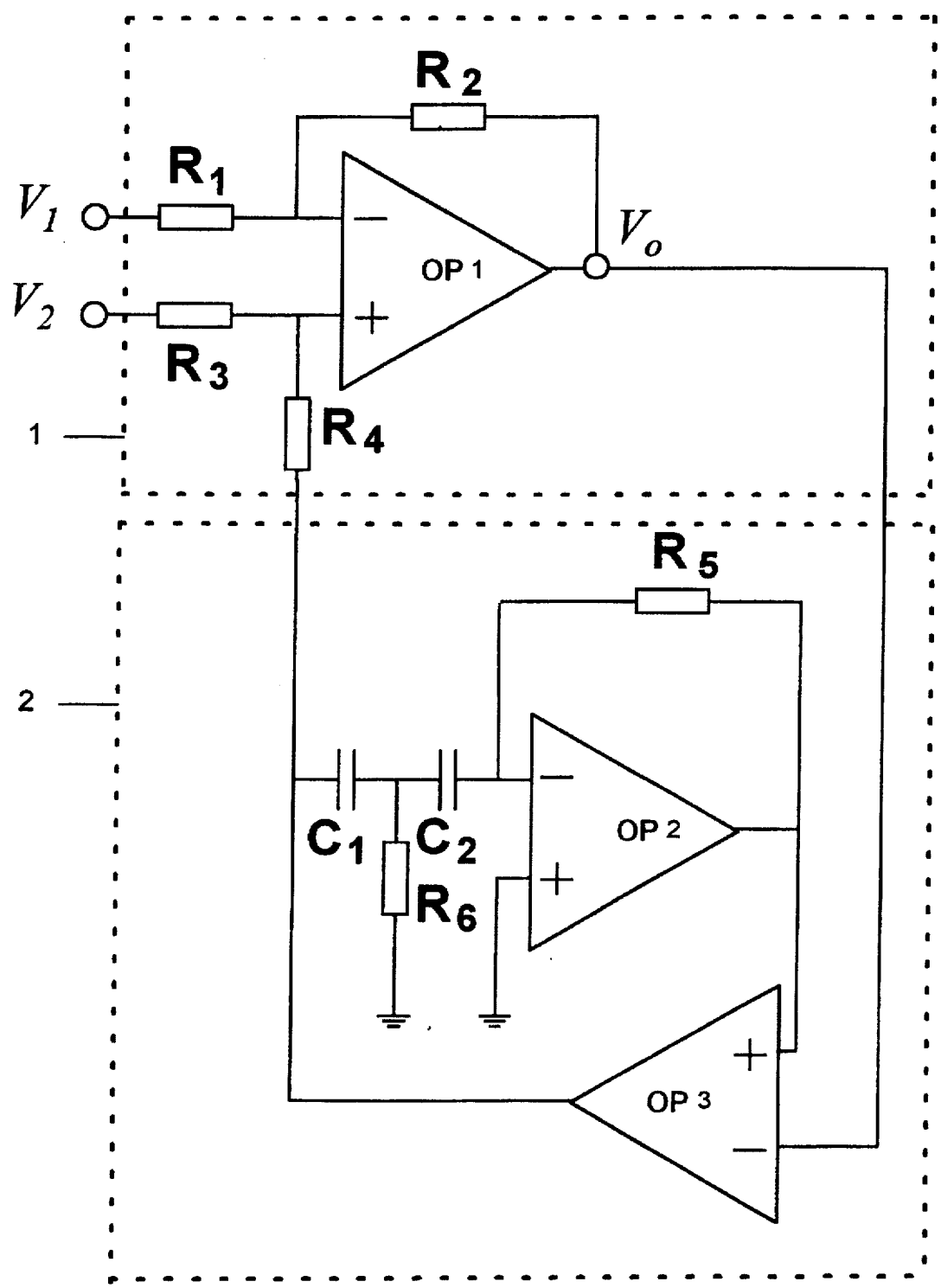
FIG. 1 shows a block diagram of a second-order highpass difference filter constructed according to the present invention.

A second-order highpass difference filter is disclosed in the present invention, which comprises a difference amplifier (1) and a feedback processing circuit (2) as shown in FIG. 1.

The difference amplifier (1) includes an operational amplifier $OP_1$ and four resistors $R_1$, $R_2$, $R_3$, and $R_4$, wherein $R_2/R_1=R_4/R_3$. The resistors $R_1$ and $R_3$ are connected to the inverting terminal (−) and the noninverting terminal (+) of the operational amplifier $OP_1$, respectively, so that an input voltage $V_1$ is able to be fed to the inverting terminal (−) of the operational amplifier $OP_1$ via the resistor $R_1$ and another input voltage $V_2$ is able to be fed to the noninverting terminal (+) of the operational amplifier $OP_1$ via the resistor $R_3$. The output terminal of the operational amplifier $OP_1$ is connected to the inverting terminal of the operational amplifier $OP_1$ with the resistor $R_2$ to form a feedback configuration. An output voltage resulting from the differential signal $V_1-V_2$ is thus obtained from the output terminal of the operational amplifier $OP_1$.

The feedback processing circuit consists essentially of two operational amplifiers $OP_2$ and $OP_3$, two resistors $R_5$ and $R_6$, and two capacitors $C_1$ and $C_2$, wherein the two capacitors $C_1$ and $C_2$ are connected to each other with a conductive wire in series. The inverting terminal (−) and the noninverting terminal (+) of the operational amplifier $OP_3$ are connected to the output terminals of the operational amplifier $OP_1$ and of the operational amplifier $OP_2$, respectively. The output terminal of the operational amplifier $OP_2$ is also connected to the inverting terminal (−) of the operational amplifier $OP_2$ with the resistor $R_5$ to form a feedback configuration, and the noninverting terminal (+) of the operational amplifier $OP_2$ is grounded. The output terminal of the operational amplifier $OP_3$ is connected to the inverting terminal of the operational amplifier $OP_2$ via the two serial capacitors $C_1$ and $C_2$, and to the noninverting terminal of the operational amplifier $OP_1$ via the resistor $R_4$. One terminal of the resistor $R_6$ is connected to the conductive wire connecting the two serial capacitors $C_1$ and $C_2$, and another terminal thereof is grounded.

A. Transfer Function

The structure of the proposed second-order highpass difference filter as illustrated in FIG. 1 comprises three operational amplifiers, two capacitors, and six resistors. After some manipulation, the transfer function F(S) is given by $$F(S) = \frac{V_0}{V_2 - V_1} = K \frac{S^2}{S^2 + \frac{C_1 + C_2}{C_1 C_2 R_5} S + \frac{1}{C_1 C_2 R_5 R_6}} \quad (1)$$

$$= K \frac{S^2}{S^2 + \frac{\omega_0}{Q} S + \omega_0^2} \quad (2)$$

$$K = \frac{R_2}{R_1} = \frac{R_4}{R_3} \quad (3)$$

$$\frac{\omega_0}{Q} = \frac{C_1 + C_2}{C_1 C_2 R_5} \quad (4)$$

$$\omega_0^2 = \frac{1}{C_1 C_2 R_5 R_6} \quad (5)$$

where

Q is quality factor;

$\omega_o$ is −3 dB frequency;

K is differential gain;

$V_O$ is the output voltage of the second-order highpass difference filter;

$V_1$ and $V_2$ are the input voltage;

S is parameter of Laplace;

$R_5$ and $R_6$ are resistors; and $C_1$ and $C_2$ are capacitors

It is apparent that the proposed filter shown in FIG. 1 is a second-order highpass filter for differential signal with a voltage gain. From the equations (4) and (5), the −3 dB frequency and quality factor of the filter are given by $$\omega_0 = \sqrt{\frac{1}{C_1 C_2 R_5 R_6}} \quad (6)$$

$$Q = \frac{1}{C_1 + C_2} \sqrt{\frac{C_1 C_2 R_5}{R_6}} \quad (7)$$

B. Design Procedure

Given the desired specification of $\omega_o$ and Q, the passive components can be determined by the following steps:

step1: choosing suitable capacitance for $C_1$ and $C_2$;

step2: calculating the resistance of $R_5$ by the equation:

$$R_5 = \frac{C_1 + C_2}{C_1 C_2} \cdot \frac{Q}{\omega_0}$$

step3: calculating resistance of $R_6$ as follows:

$$R_6 = \frac{1}{C_1 C_2 R_5 \omega_0^2}$$

The design procedure is very simple and easy to be implemented. It is not necessary to solve difficult quadratic equations, which usually results in complex valued or negative solutions.

C. Implementation by Instrumentation Amplifier

Figure 4:
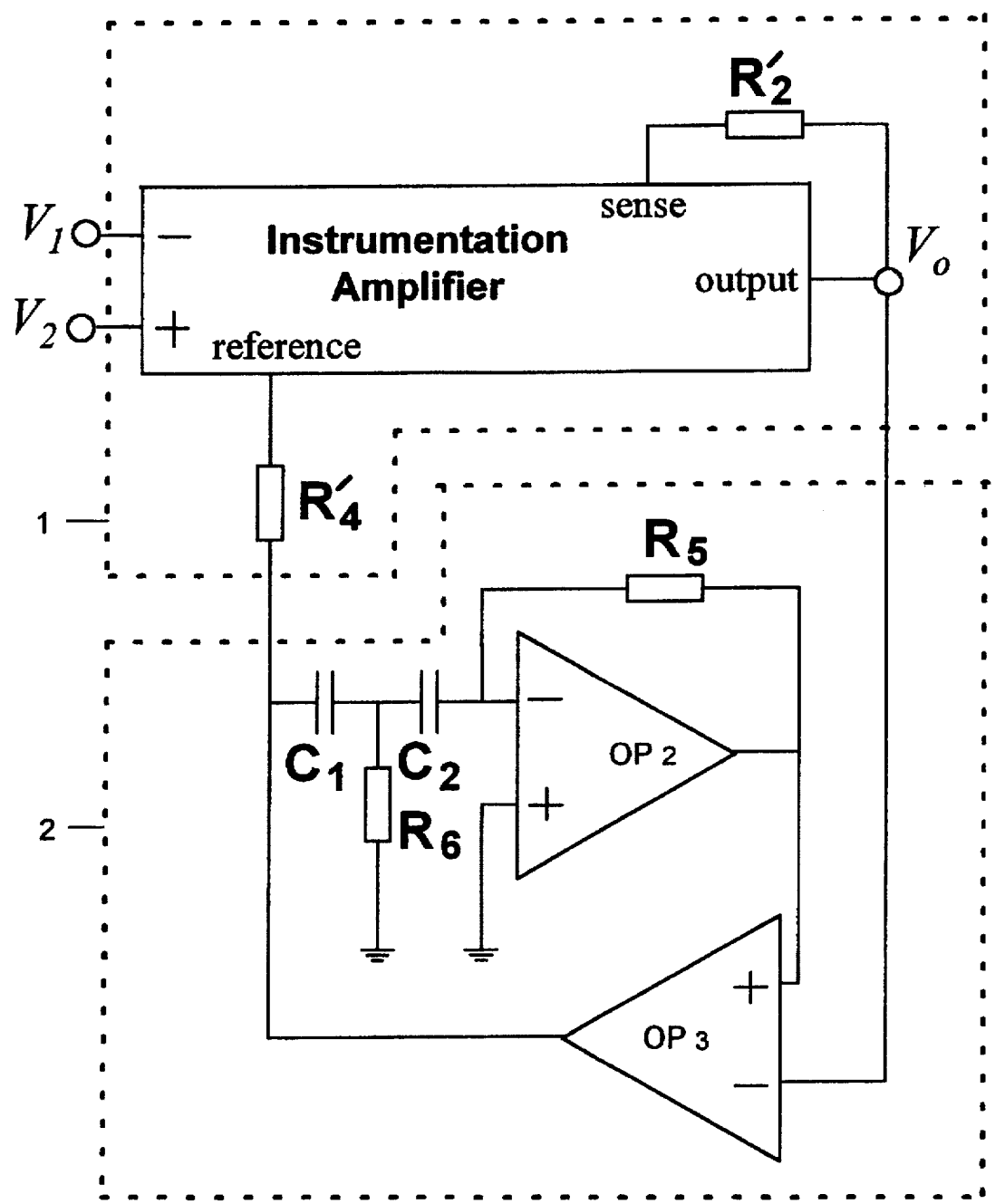
FIG. 4 shows a block diagram of a second-order highpass difference filter of the present invention realized with an instrumentation amplifier.

As shown in FIG. 4, the difference amplifier (1) shown in FIG. 1 can be realized with an instrumentation amplifier AD625 (Analog Devices, U.S.). In addition to the function of second-order highpass filtering, the proposed filter shown in FIG. 4 preserves the main properties of the instrumentation amplifier, e.g. low noises, high input impedance, high CMRR, etc.

The technique of this invention, a second-order highpass difference filter, can be made into a monolithic integrated circuit which functions as a preamplifier with a second-order highpass filter.

D. Results of Computer Simulation

To demonstrate the feasibility of this invention, a second-order highpass difference filter, computer simulation with Pspice software was carried out and described as follows:

Given the desired quality factor Q=0.707, −3 dB frequency f=100 Hz, capacitors $C_1$=100 nF and $C_2$=100 nF, the two resistance of $R_5$ and $R_6$ can be obtained according to the step 2 and step 3 of the Design Procedure, which are $R_5$=22.5 KΩ, $R_6$=11.26KΩ. Assuming the input voltage $V_1$=1 V(ac), $V_2$=2 V(ac), and the resistors $R_1$=10 KΩ, $R_2$=110 KΩ, $R_3$=10 KΩ, $R_3$=110 KΩ (differential gain K=11), the frequency response of the proposed second-order highpass difference filter depicted in FIG. 1 was obtained and shown in FIG. 2 and FIG. 3 by volt and decibel (dB) respectively.

Figure 2:
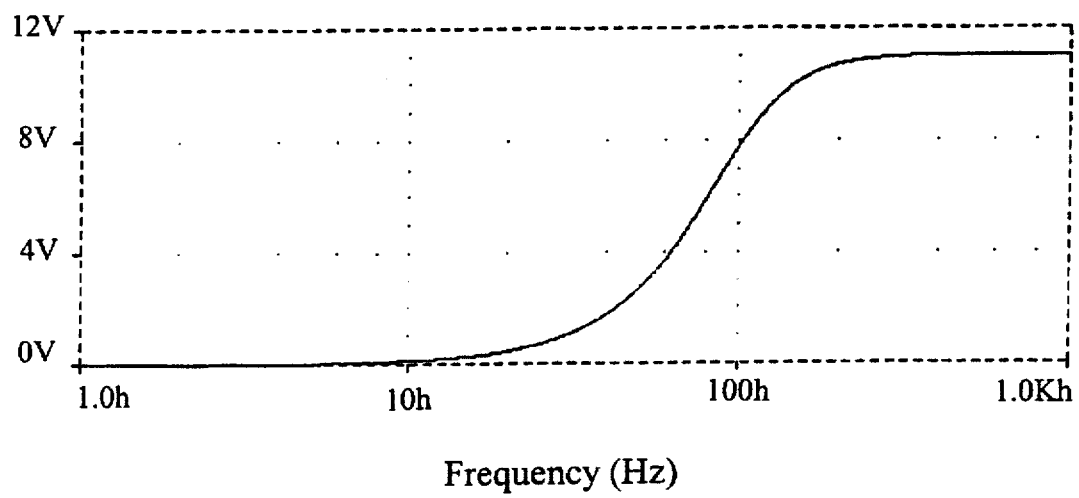
FIG. 2 is a frequency vs. volt plot which shows a simulation of frequency response of the second-order highpass difference filter shown in FIG. 1, wherein the differential input $V_2-V_1=1$ V, −3 dB frequency $f_o=100$ Hz, and differential gain K=11.

The units of horizontal and vertical axes in FIG. 2 are Hertz (Hz) and volt respectively. The output voltage is less than 8 V if the frequency is less than 100 Hz, and the output voltage decreases as the frequency decreases. When the frequency is higher than 200 Hz, the output voltage is 11 V nearly. It is apparent that FIG. 2 is a typical frequency response of a highpass filter.

Figure 3:
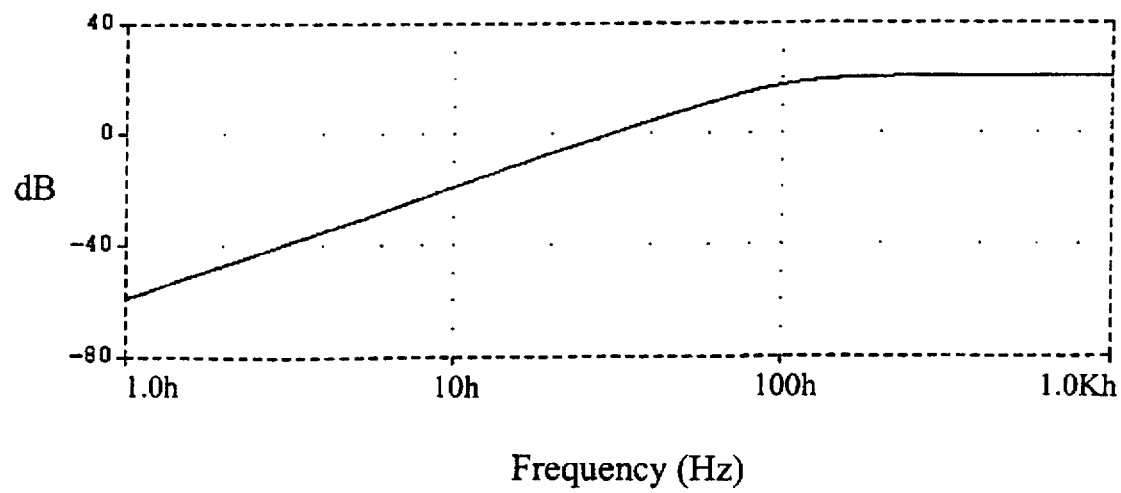
FIG. 3 is a frequency vs. dB plot which shows a simulation of frequency response of the second-order highpass difference filter shown in FIG. 1, wherein the low-frequency suppression is −40 dB/decade.

The units of horizontal and vertical axes in FIG. 3 are Hertz (Hz) and decibel (dB), respectively. The performance of low-frequency suppression is demonstrated by the attenuation of −40 dB/decade. The results of the simulation verify the theoretical analysis and demonstrate the applicability of the second-order highpass difference filter proposed in FIG. 1.

E. Results of Practical Tests

The circuit depicted in FIG. 1 was realized with an instrumentation amplifier AD625 as shown in FIG. 4. The values of the passive elements were the same as those used in the above simulation (quality factor Q=0.707, −3 dB frequency $f_o$=100 Hz, and differential gain K=11). Please note that $R_2$=($R_2$−10) KΩ and $R_4$=($R_4$−10)KΩ for taking the resistance in AD625 into account.

Figure 5:
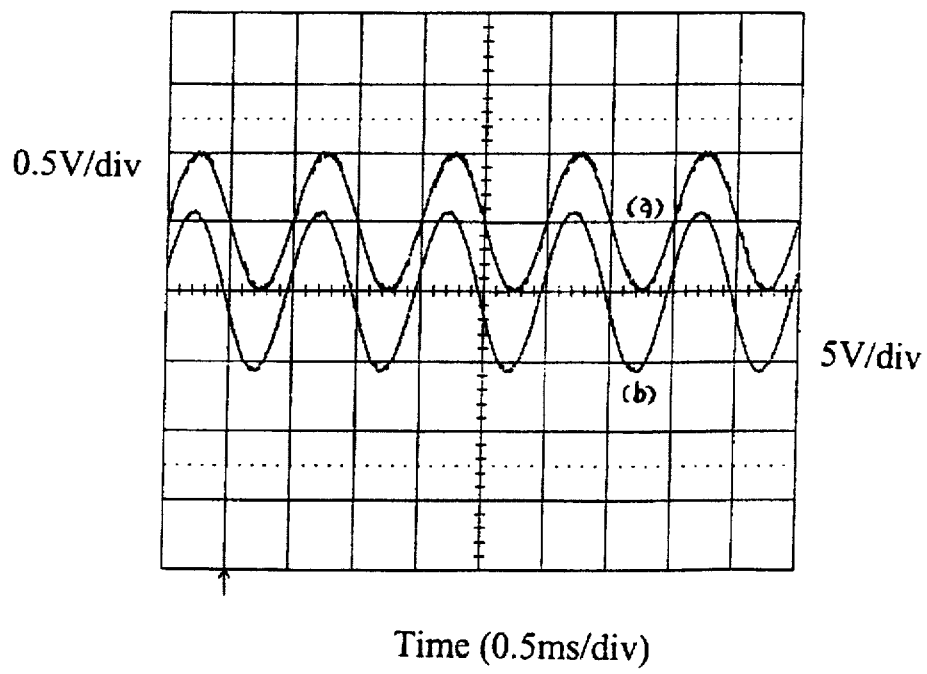
FIG. 5 shows test results of the second-order highpass difference filter shown in FIG. 4, wherein signal (a) is differential input 0.5 V+0.5 sin(2π1000t)V, and signal (b) is output 5.5 sin(2π1000t)V, wherein the dc voltage 0.5 V has been eliminated.

As shown in FIG. 5, a differential signal (signal (a)) composed of a sinusold of 1000 Hz and a dc signal both with amplitude of 0.5 V (volt) was arranged to test the proposed filter shown in FIG. 4. It is clear that the dc signal has been eliminated thoroughly and the sinusold has an amplification of 11 at the output terminal of the filter (signal (b)). The time scale is 0.5 ms/div and the amplitude scales of signal (a) and signal (b) are 0.5 V/div and 5 V/div respectively.

Figure 6:
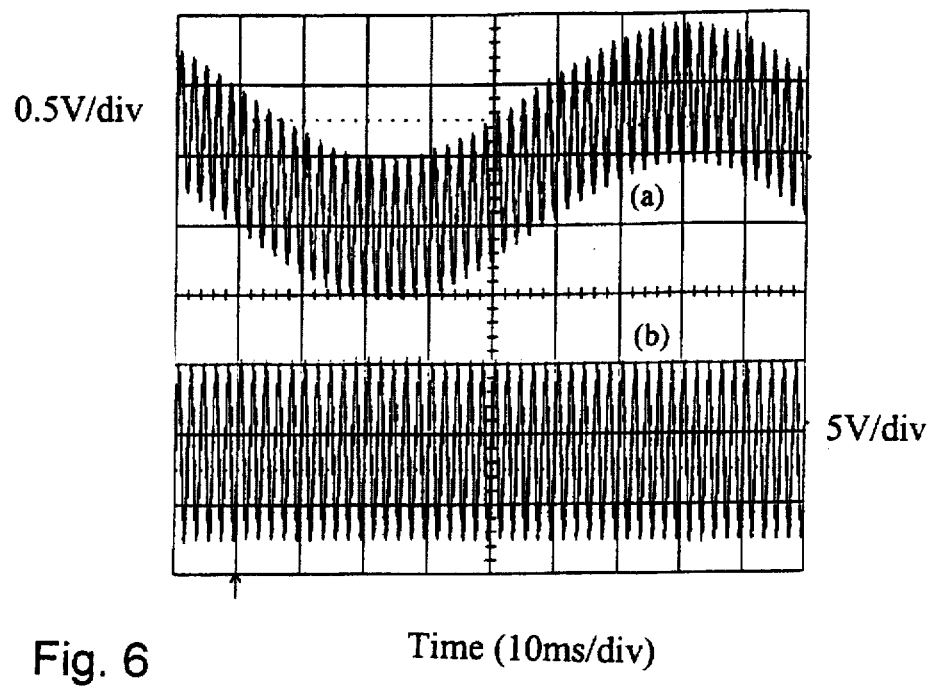
FIG. 6 shows test results of the second-order highpass difference filter shown in FIG. 4, wherein signal (a) is differential input 0.5[sin(2π10t)+sin(2π500t)]V, and signal (b) is output voltage which can be represented by 5.5 sin(2π500t)V with a little sinusoid of 10 Hz.

FIG. 6 shows that a differential signal (signal (a)) composed of two sinusoids of 10 Hz and 500 Hz both with an amplitude of 0.5 V was arranged to test the proposed filter shown in FIG. 4. It can be seen from FIG. 6 that the sinusoid with the frequency of 10 Hz has been substantially removed and the sinusoid with the frequency of 500 Hz has an amplification of 11 at the output terminal of the filter (signal (b)). The time scale is 10 ms/div and the amplitude scales of signal (a) and signal (b) are 0.5 V/div and 5 V/div, respectively.

Figure 7:
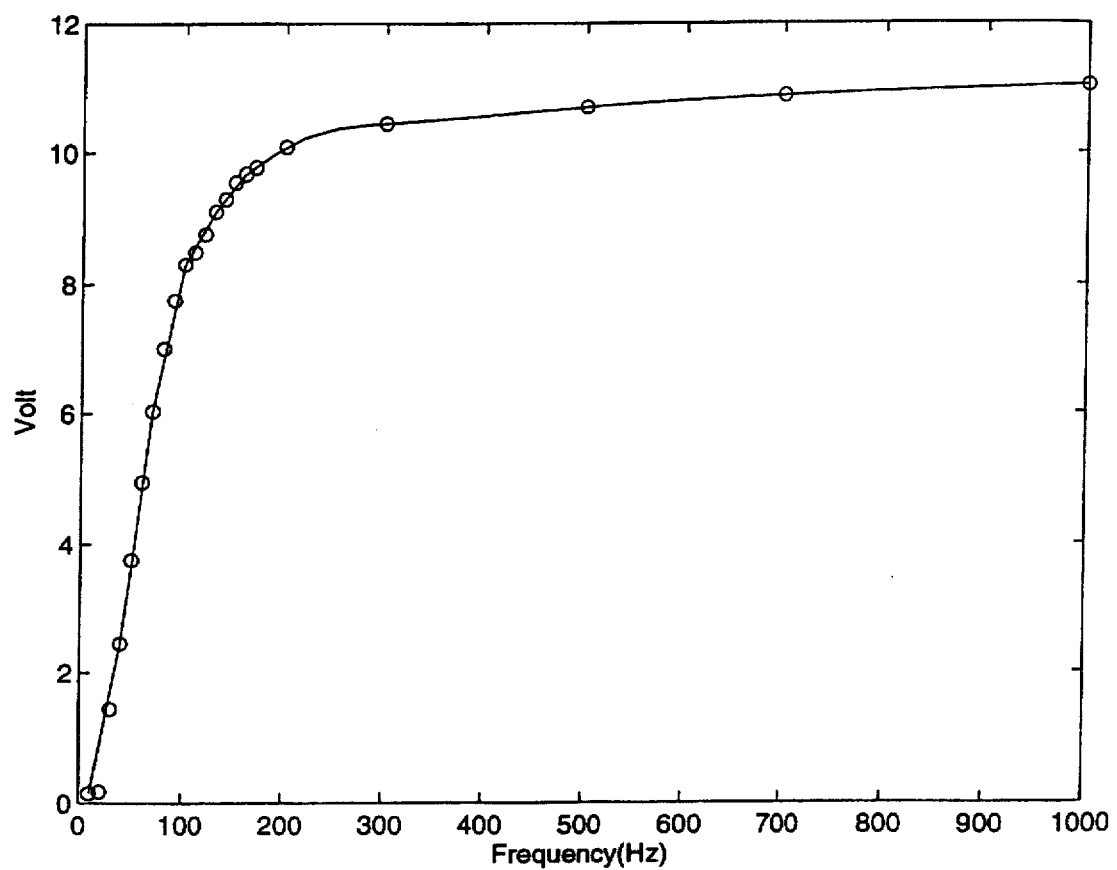
FIG. 7 is a frequency vs. volt plot which shows frequency response of the second-order highpass difference filter shown in FIG. 4.

FIG. 7 is the frequency response of the proposed second-order highpass difference filter shown in FIG. 4. The input signals $V_1=-0.5$ V and $V_2=0.5$ $\sin(2\pi ft)$V, where $f$ is frequency and $t$ is time. The test frequency $f$ was selected between 10 Hz and 1000 Hz, and the test results are represented by the symbol 'o'. It is clear that the output voltage will decrease as the test frequency decreases, and the output voltage will have an amplification of 11 provided the test frequency is higher than 200 Hz. The units of the horizontal and vertical axex in FIG. 7 are Hertz (Hz) and volt respectively. The frequency response of the implementation Shown in FIG. 7 is concordant with that of the computer simulation shown in FIG. 2.

It can be readily understood from above that the proposed filters shown in FIGS. 1 and 4 have the functions of second-order highpass filtering and differential amplification.

The second-order highpass difference filter constructed in accordance with the present invention may be fabricated as a single chip IC or part of any other signal processing IC.

Having thus described the present invention, which is now deemed appropriate for Letters Patent is set out in the following appended claims.

What is claimed is:

1. A second-order highpass difference filter comprising a difference amplifier and a feedback processing circuit, said difference amplifier comprising an operational amplifier $OP_1$, and four resistors $R_1$, $R_2$, $R_3$ and $R_4$, wherein $R_2/R_1=R_4/R_3$, the resistors $R_1$ and $R_3$ are connected to the inverting terminal (−) and the noninverting terminal (+) of the operational amplifier $OP_1$, respectively, so that an input voltage $V_1$ is be fed to the inverting terminal (−) of the operational amplifier $OP_1$ via the resistor $R_1$ and another input voltage $V_2$ is be fed to the noninverting terminal (+) of the operational amplifier $OP_1$ via the resistor $R_3$, and the output terminal of the operational amplifier $OP_1$ is connected the inverting terminal (−) of the operational amplifier $OP_1$ with the resistor $R_2$; and said feedback processing circuit comprising two operational amplifiers $OP_2$ and $OP_3$, two resistors $R_5$ and $R_6$, and two capacitors $C_1$ and $C_2$ which are connected with each other in series with a conductive wire, wherein the inverting terminal (−) and the noninverting terminal (+) of the operational amplifier $OP_3$ are connected to the output terminals of the operational amplifier $OP_1$ and of the operational amplifier $OP_2$, respectively, the output terminal of the operational amplifier $OP_2$ is also connected to the inverting terminal (−) of the operational amplifier $OP_2$ with the resistor $R_5$, and the noninverting (+) terminal of the operational amplifier $OP_2$ is grounded, the output terminal of the operational amplifier $OP_3$ is connected to the inverting terminal of the operational amplifier $OP_2$ via the two capacitors $C_1$ and $C_2$ in series and to the noninverting terminal of the operational amplifier $OP_1$ via the resistor $R_4$, wherein one terminal of the resistor $R_6$ is connected to the conductive wire and another terminal thereof is grounded.

2. The filter according to claim 1, wherein the difference amplifier is implemented by a instrumentation amplifier.

* * * * *